(12) United States Patent
Voelkel

(10) Patent No.: US 12,035,482 B2
(45) Date of Patent: Jul. 9, 2024

(54) ELECTRONIC DEVICE WITH MULTI-DIAMETER FEMALE CONTACTS AND RELATED METHODS

(71) Applicant: Eagle Technology, LLC, Melbourne, FL (US)

(72) Inventor: John Voelkel, Palm Bay, FL (US)

(73) Assignee: EAGLE TECHNOLOGY, LLC, Melbourne, FL (US)

( * ) Notice: Subject to any disclaimer, the term of this patent is extended or adjusted under 35 U.S.C. 154(b) by 62 days.

(21) Appl. No.: 17/650,096

(22) Filed: Feb. 7, 2022

(65) Prior Publication Data

US 2023/0254980 A1    Aug. 10, 2023

(51) Int. Cl.
*H05K 1/00* (2006.01)
*H05K 1/02* (2006.01)
(Continued)

(52) U.S. Cl.
CPC .................. *H05K 3/306* (2013.01)

(58) Field of Classification Search
CPC .......... H05K 1/00; H05K 1/02; H05K 1/0213; H05K 1/0228; H05K 1/0231; H05K 1/0237; H05K 1/0298; H05K 1/092; H05K 1/111; H05K 1/112; H05K 1/113; H05K 1/114; H05K 1/115; H05K 1/162; H05K 1/181; H05K 1/182; H05K 3/0026; H05K 3/0326; H05K 3/0623; H05K 3/34; H05K 3/42; H05K 3/225; H05K 3/281; H05K 3/306; H05K 3/308; H05K 3/1216; H05K 3/3421; H05K 3/3426; H05K 3/3447; H05K 3/3485; H05K 3/4038; H05K 3/4614; H05K 3/4658; H01L 21/486; H01L 21/4857; H01L 21/6835; H01L 21/76877; H01L 21/76895; H01L 23/5226; H01L 23/5383; H01L 23/5385; H01L 23/49811; H01L 23/49822
(Continued)

(56) References Cited

U.S. PATENT DOCUMENTS 5,337,219 A * 8/1994 Carr ........................ H05K 3/225
439/47
6,727,174 B1    4/2004 Kotecki et al.
(Continued)

OTHER PUBLICATIONS

L3HARRIS—"Next-generation Compute Cluster Farm and Processing Solutions" https://www.l3harris.com/resources/other/next-generation-compute-cluster-farm-and-processing-solutions-catalog; 2021: pp. 3.

*Primary Examiner* — Xiaoliang Chen
(74) *Attorney, Agent, or Firm* — ALLEN, DYER, DOPPELT, + GILCHRIST, P.A. Attorneys at Law

(57) ABSTRACT

An electronic device may include a connector having a connector body and conductive pins extending outwardly from the connector body, and a circuit board having a dielectric layer, and spaced apart female contacts extending therein. Each female contact may include a conductive tubular via, a core within the conductive tubular via, and a conductive cup having a lower end abutting and joined to the conductive tubular via and an upper end defining a recess receiving a corresponding conductive pin of the connector. The conductive cup may have an outer diameter greater than an outer diameter of the conductive tubular via.

15 Claims, 11 Drawing Sheets

(51) Int. Cl.
*H05K 3/26* (2006.01)
*H05K 3/30* (2006.01)
*H05K 3/34* (2006.01)
*H05K 3/42* (2006.01)

(58) Field of Classification Search
USPC ........ 174/266, 259, 260, 261; 361/792, 793, 361/794, 795; 439/44, 45, 47; 29/846; 257/692, 693
See application file for complete search history.

(56) References Cited

U.S. PATENT DOCUMENTS

| | | | |
|---|---|---|---|
| 8,586,431 B2 | 11/2013 | Farooq et al. | |
| 9,679,841 B2* | 6/2017 | Jomaa | H01L 23/5226 |
| 10,262,947 B2 | 4/2019 | Oganesian et al. | |
| 10,517,167 B1* | 12/2019 | DeRoy | H05K 1/181 |
| 10,925,151 B2 | 2/2021 | DeRoy et al. | |
| 11,283,204 B1* | 3/2022 | Loch | H05K 1/113 |
| 2001/0015491 A1* | 8/2001 | Shiraishi | H01L 23/49811 |
| | | | 257/E23.068 |
| 2009/0084595 A1* | 4/2009 | Park | H05K 3/281 |
| | | | 29/846 |
| 2016/0088731 A1* | 3/2016 | Daghighian | H05K 1/162 |
| | | | 174/259 |
| 2016/0225694 A1* | 8/2016 | Barth | H01L 23/481 |
| 2017/0149155 A1* | 5/2017 | McKenney | H05K 3/42 |
| 2021/0028588 A1* | 1/2021 | De Roy | H05K 3/1216 |
| 2021/0107080 A1* | 4/2021 | De Roy | H01L 21/486 |

\* cited by examiner

ELECTRONIC DEVICE WITH MULTI-DIAMETER FEMALE CONTACTS AND RELATED METHODS

TECHNICAL FIELD

The present disclosure relates to the field of electronic devices, and, more particularly, to interconnects between electronic devices and related methods.

BACKGROUND

An electronic device may include one or more circuit card modules inserted into a chassis and electronically coupled to a backplane of the electronic device. A typical circuit card module includes one or more circuit boards. A typical circuit board is a planar board that mechanically supports electronic components. The electronic components may comprise, for example, resistors, capacitors, switches, batteries, and other more complex integrated circuit components, i.e. microprocessors, memories, field-programmable gate array (FPGA)s and the like. The circuit board typically comprises a dielectric material.

A simple circuit board may include conductive traces on its surface for connecting the electronic components to each other. As electronic circuitry has become more complex, multi-layer circuit boards with at least two electrically conductive trace layers sandwiched between dielectric layers have been developed. Typically, the different conductive trace layers of the multi-layer circuit board may be electrically connected through vertically extending vias formed by a drilling and plating process, which comprise conductive materials, for example, copper or other metal or alloy.

A typical backplane incudes conductive traces sandwiched between dielectric layers similar to the circuit board construction. The backplane may allow two or more circuit card modules to interconnect through electrically conductive pads on the major surfaces thereof. In other words, the edge surface of the circuit card module is typically mounted onto the major surface of the backplane at a 90-degree angle. Moreover, this interconnection is typically accomplished using an interconnector component on the major surface of the circuit card module and the backplane. Typically, an interconnector component physically couples the circuit card module and backplane together and electrically couples the electrically conductive pads.

VPX is an ANSI standard that provides VMEbus-based systems with support for switched fabrics over a high speed connector. Switched fabrics technology supports the implementation of multiprocessing systems that use the fastest possible communications between processors. The high speed connectors are often referred to as VPX connectors (e.g., the MultiGig RT2 connector available from TE Connectivity of Switzerland). VPX connectors are rated typically to support up to 16 Giga bits per second (Gbps).

The current generation of industry standard VPX connectors are challenged to support a 25 GBps data rate at desirable Bit Error Rates (BER) when trying to communicate from a 25 Gbps transceiver chip on the first daughter card, through a VPX connector, across 12 inches of backplane, through another VPX connector to a second transceiver chip on a second daughter card. This issue is due in large part to signal degradations caused by the interactions between independent signals (i.e. crosstalk), which occurs when the conductors carrying these signals are oriented in close proximity and parallel with one another over any appreciable distance, which at 25 Gb/s is a fraction of an inch. This may occur especially in the region where many independent signals are to be propagated between component cards in the system through high density interconnect systems, such as VPX, where the connector pins and their respective conductive features within the circuit card are thus aligned. To reduce the amount of crosstalk experienced in the vicinity of these VPX connectors, it may be desirable to increase the separation between each conductive path. While this can only be done to a limited extent within the connector itself, this separation may be increased by reducing the via diameter within the circuit card under the connector to the greatest extent possible. In one approach described in U.S. Pat. No. 10,925,151 to DeRoy et al., also assigned to the present application's assignee, a modified VPX connector pin is described which is compliant to and can be used for avionics applications. As such, the connector may survive avionics environmental exposures, as well as other harsh environments associated with military hardware applications.

Referring to FIGS. 1A-1B, as described in U.S. Pat. No. 10,925,151 to DeRoy et al., a typical female contact connection 100 illustrates one approach to reducing this crosstalk issue. The connection 100 is between a backplane 101 and a pin 102 from a circuit card module is shown. The backplane 101 comprises a dielectric layer 103, a conductive cup 104 in the dielectric layer, a blind buried micro-via 105 in the dielectric layer and coupled to the conductive cup, and a buried via of significantly reduced diameter from the conductive cup 106 in the dielectric layer aligned with the conductive cup and coupled to the micro-via. Unfortunately, manufacturing such a female contact may require multiple lamination steps, which may be difficult and may result in low manufacturing yields.

SUMMARY

Generally, an electronic device may include a connector comprising a connector body and a plurality of conductive pins extending outwardly from the connector body, and a circuit board. The circuit board may include a dielectric layer, and a plurality of spaced apart female contacts extending within the dielectric layer. Each female contact may comprise a conductive tubular via, a core within the conductive tubular via, and a conductive cup having a lower end abutting and joined to the conductive tubular via and an upper end defining a recess receiving a corresponding conductive pin of the connector. The conductive cup may have an outer diameter greater than an outer diameter of the conductive tubular via.

More specifically, the conductive cup may comprise an uppermost flange coupled to the upper end. The electronic device may also comprise solder within the recess of each conductive cup and surrounding the corresponding conductive pin. The conductive tubular via may have a constant outer diameter. The outer diameter of the conductive cup may be within a range of 1.5 to 2.5 times the outer diameter of the conductive tubular via. The conductive cup may have a height within a range of 0.1 to 0.5 times a height of the conductive tubular via. The outer diameter of the conductive cup may be within a range of 500-700 microns.

Also, the plurality of spaced apart female contacts may be spaced apart a distance in a range of 1200-1500 microns. The circuit board may comprise a multilevel circuit board. The electronic device may include circuitry coupled to the plurality of spaced apart female contacts and operable at a frequency range less than 25 GHz. For example, each female contact may comprise plated copper. The core may comprise one of a dielectric and a conductor.

Another aspect is directed to a method of making a circuit board to be coupled to a connector comprising a connector body and a plurality of conductive pins extending outwardly from the connector body. The method may comprise forming a plurality of passageways in a dielectric layer, forming a first conductive layer within the plurality of passageways, and forming a core within the plurality of passageways to define a plurality of conductive tubular vias. The method may comprise removing an uppermost portion of the plurality of conductive tubular vias to define a corresponding plurality of enlarged passageways above the plurality of conductive tubular vias, and forming a second conductive layer within the plurality of enlarged passageways to provide a corresponding plurality of spaced apart female contacts. Each female contact may include a conductive cup having a lower end abutting and joined to a respective conductive tubular via and an upper end defining a recess to receive a corresponding conductive pin of the connector. The conductive cup may have an outer diameter greater than an outer diameter of the respective conductive tubular via.

In some embodiments, the forming of the first conductive layer and the forming of the second conductive layer may each comprise plating. The removing of the uppermost portion of the plurality of conductive tubular vias may comprise removing by drilling.

DETAILED DESCRIPTION

Figure 1A:
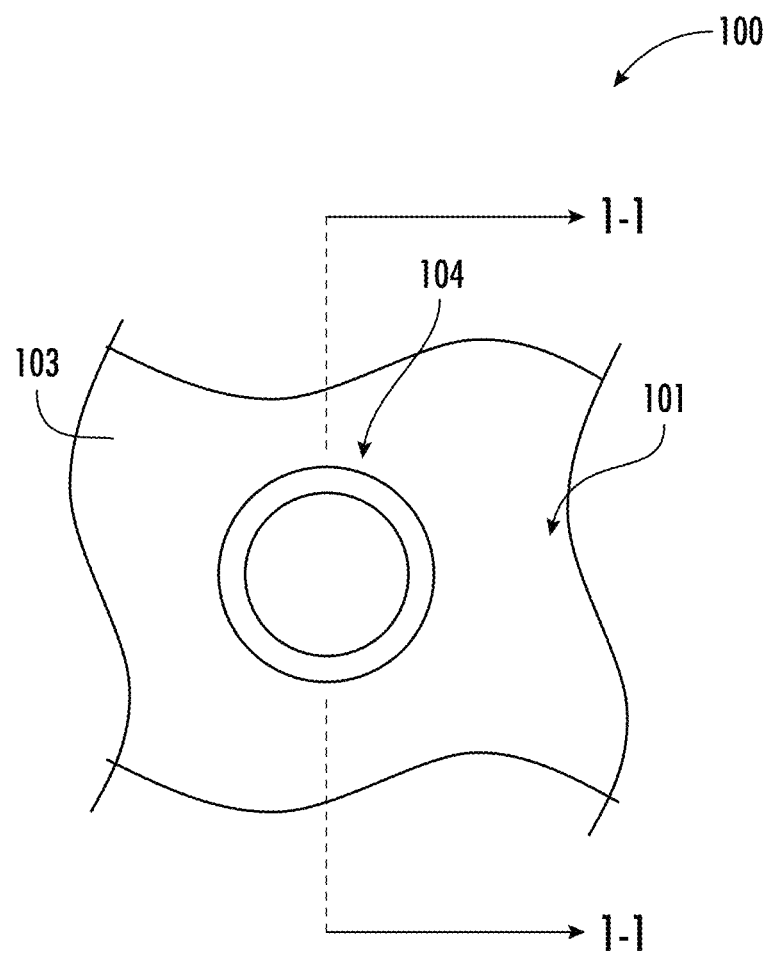
FIG. 1A is a schematic top view of a female contact from an electronic device, according to the prior art.

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and base 100 reference numerals are used to indicate similar elements in alternative embodiments.

This embodiments of the present disclosure may simplify the construction of a female contact with similar signal integrity performance in order to eliminate the multiple laminations, eliminate the blind buried micro-vias, and allow construction of the contact as a monolithic construct compatible with industry standard printed circuit board manufacturing methods to reduce cost and increase yields.

Figure 2:
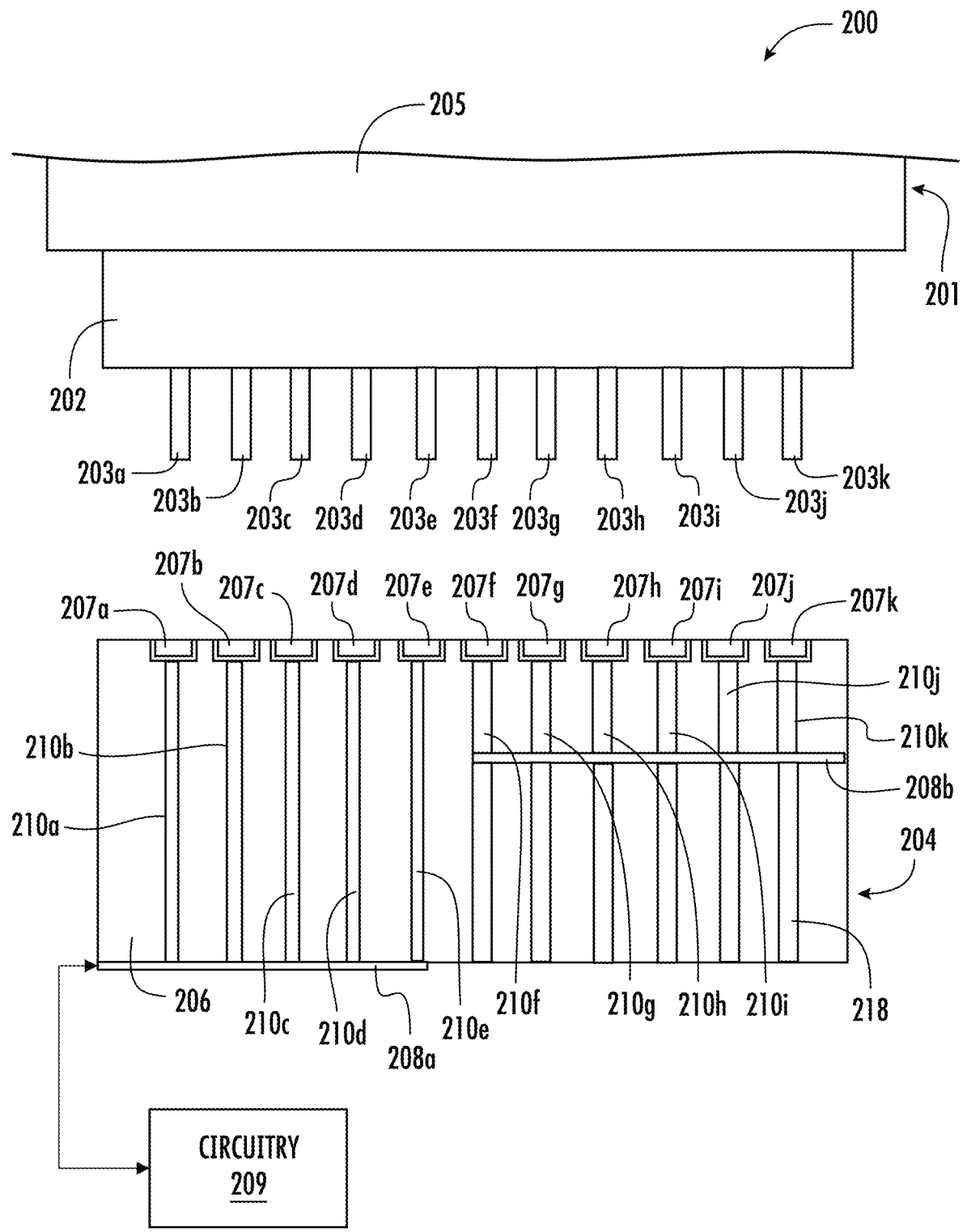
FIG. 2 is a schematic diagram of an electronic device, according to a first embodiment of the present disclosure.
Figure 3:
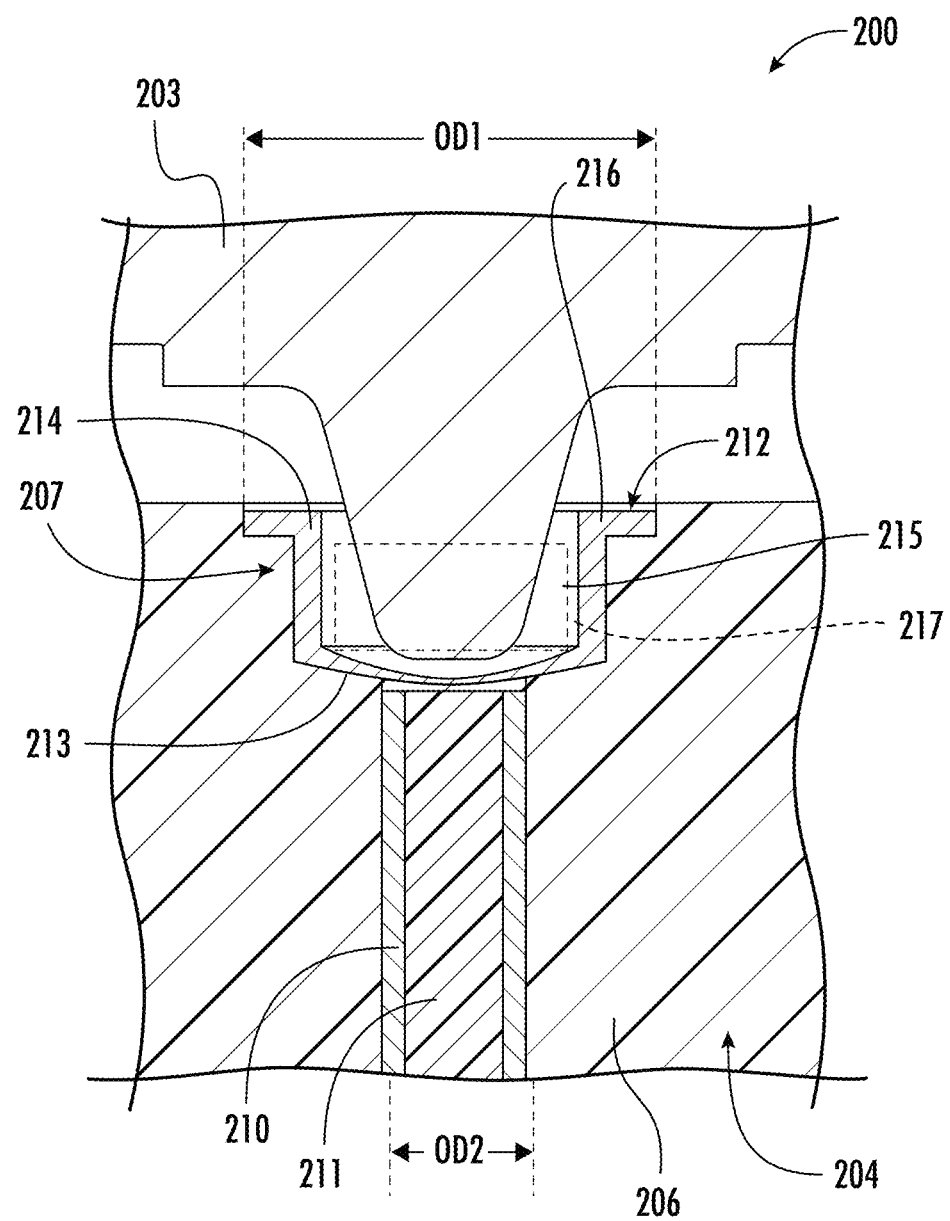
FIG. 3 is a partial schematic cross-section view of the electric device from FIG. 2 also along line 1-1.
Figure 4:
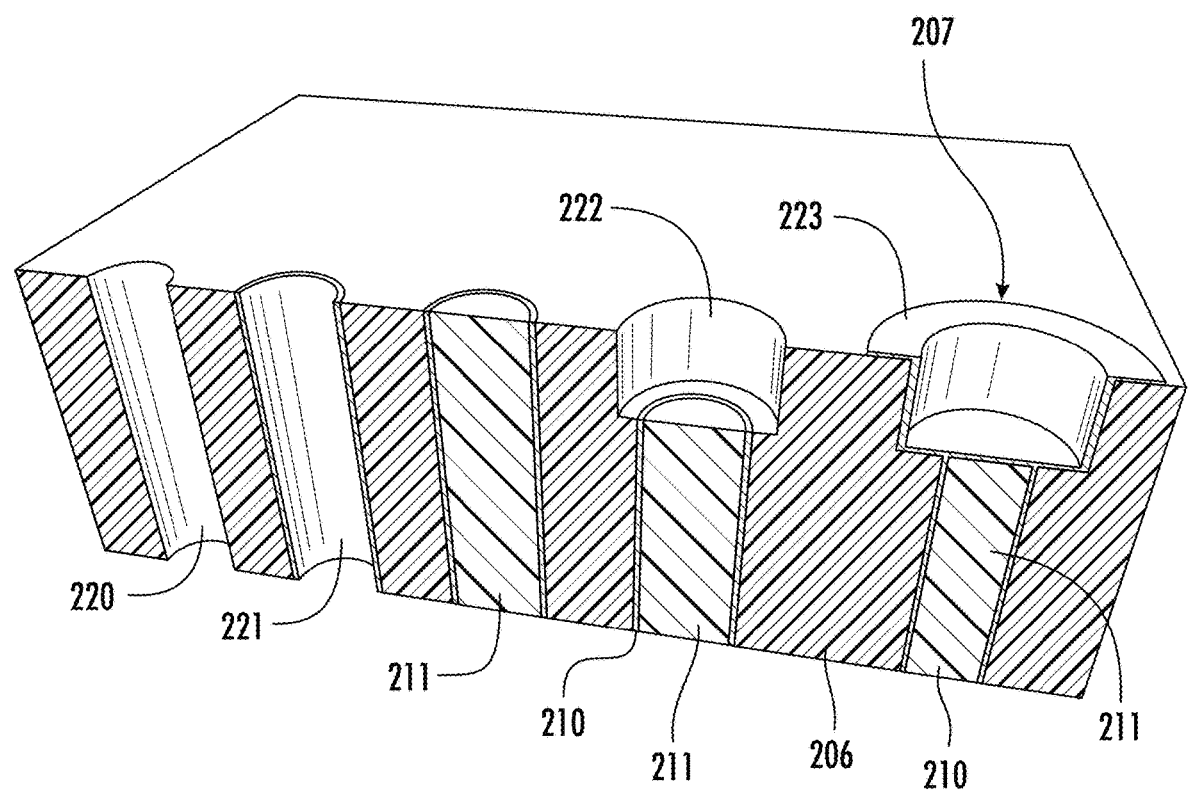
FIG. 4 is a schematic fragmentary section view of the electric device from FIG. 2 during a method for making the circuit board.
Figure 5:
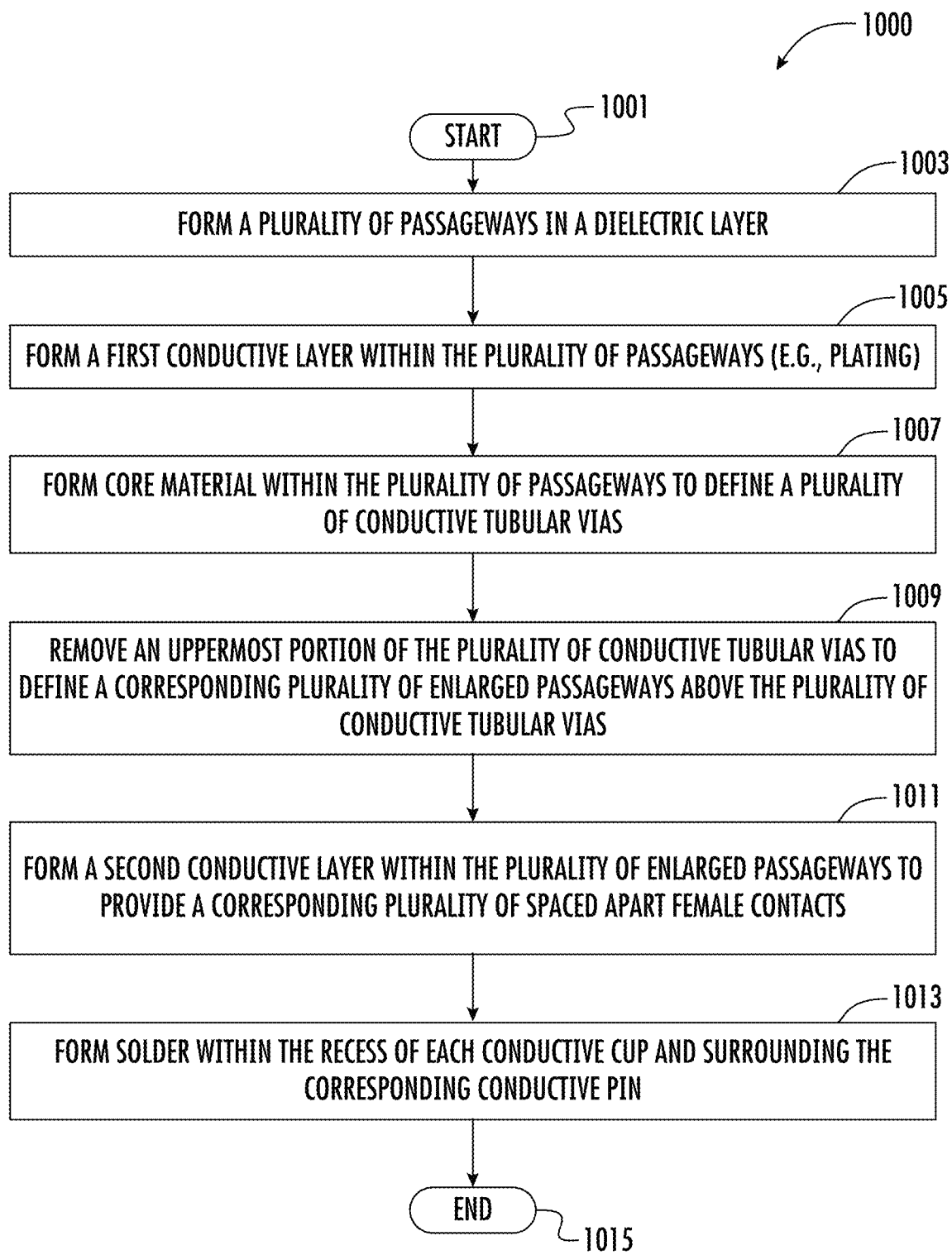
FIG. 5 is a flowchart of the method for making the circuit board, according to the present disclosure.

Referring to FIGS. 2-3, an electronic device 200 according to the present disclosure is now described. The electronic device 200 illustratively includes a connector 201 comprising a connector body 202 and a plurality of conductive pins 203a-203k extending outwardly from the connector body. The electronic device 200 illustratively includes a circuit board 204 to be coupled to the connector 201.

In some applications, the circuit board 204 comprises a backplane circuit board receiving one or more connectors 201. Each connector 201 is coupled to a respective daughter circuit board 205 (i.e. a circuit card module). For example, each daughter circuit board 205 may comprise a Vita 46/VPX standard circuit board with a 3U form factor. As will be appreciated, a plurality of daughter circuit boards 205 may be coupled to the circuit board 204. The teachings of the present disclosure may be applicable to other interconnections between two circuit cards, such as "mezzanine" assemblies where two circuit boards are sandwiched physically parallel to one another (rather than 90°/transverse positioning of daughter circuit boards and the backplane circuit board). Additionally, while these embodiments are applicable to a variant of VPX connectors, there may be applicability of the present disclosure for vias that are not directly related to a physical board-to-board connector.

The circuit board 204 illustratively comprises a dielectric layer 206 (e.g. polymer, such as liquid crystal polymer, epoxy), and a plurality of spaced apart female contacts 207a-207k extending within the dielectric layer. The circuit board 204 is a multilevel circuit board and illustratively comprises a plurality of conductive traces 208a-208b at multiple depths.

Also, the plurality of spaced apart female contacts 207a-207k may be spaced apart a distance in a range of 1200-1500 microns. The electronic device 200 illustratively includes circuitry 209 coupled to the plurality of spaced apart female contacts 207a-207k and may be operable at a frequency range less than 25 GHz with a data throughput greater than 20 Gb/s, for example.

Each female contact 207a-207k comprises a conductive tubular via 210a-210k, a core 211 within the conductive tubular via, and a conductive cup 212 having a lower end 213 abutting and joined to the conductive tubular via and an upper end 214 defining a recess 215 receiving a corresponding conductive pin 203 of the connector 201. In the illustrated embodiment, the lower end 213 is curved downward. The conductive cup 212 illustratively comprises an outer diameter OD1 greater than an outer diameter OD2 (e.g. 400 micrometers) of the conductive tubular via 210. In other words, the female contact 207a-207k comprises a dual diameter contact. The conductive cup 212 comprises an uppermost flange 216 carried by a major surface of the dielectric layer 206 and coupled to the upper end 214. The electronic device illustratively includes solder 217 within the recess 215 of each conductive cup 212 and surrounding the corresponding conductive pin 203, providing a reliable electrical connection.

In the illustrated embodiment, the conductive tubular via 210 has a constant outer diameter, but this may vary due to manufacturing limitations. The conductive tubular via 210 has a tubular thickness (e.g. 50 micrometers) in a range of 8-15% of the outer diameter OD1 of the conductive cup 212. The outer diameter OD1 of the conductive cup 212 may be within a range of 1.5 to 2.5 times the outer diameter OD2 of the conductive tubular via 210. The conductive cup 212 may have a height within a range of 0.1 to 0.5 times a height of the conductive tubular via 210. The outer diameter OD1 of the conductive cup 212 may be within a range of 500-700 microns.

For example, each female contact 207a-207k and each conductive trace 208a-208b may comprise one or more of copper, aluminum, silver, and gold. These components may comprise plated conductive materials in some embodiments. The core 211 illustratively comprises a dielectric (e.g. air, dielectric resin or epoxy), but may alternatively comprise a conductor, such as a conductive epoxy.

Also, as perhaps best seen in FIG. 2, it should be appreciated that the conductive tubular vias 210a-210k extend to varying depths. Nonetheless, during manufacturing, the passageways for the conductive tubular vias 210a-210k may be formed to pass completely through the dielectric layer 206 (i.e. drilled in some embodiments). To provide for varying depth, the passageways of shallow tubular vias 210f-210k are backfilled with dielectric fill 218.

Referring now additionally to FIGS. 4-5 & 6A-6B, a method of making a circuit board 204 is now described, which begins at Block 1001 in a flowchart 1000. The circuit board 204 is to be coupled to a connector 201 comprising a connector body 202 and a plurality of conductive pins 203a-203k extending outwardly from the connector body. The method comprises forming a plurality of passageways 220 in a dielectric layer 206. (Block 1003) For illustrative clarity, only one passageway 220 is shown. The forming of the plurality of passageways 220 may comprise a mechanical drilling step in some embodiments. In other embodiments, this step may comprise an etching step or laser drilling.

The method illustratively includes forming a first conductive layer 221 within the plurality of passageways 220. (Block 1005). In some embodiments, the forming of the first conductive layer 221 may comprise a plating step, but may alternatively comprise a deposition step.

The method comprises forming a core 211 within the plurality of passageways 220 to define a plurality of conductive tubular vias 210. (Block 1007). The forming of the core 211 may comprise an injection of resin material into the plurality of passageways 220 with the first conductive layer 221 therein.

The method comprises removing an uppermost portion of the plurality of conductive tubular vias 210 to define a corresponding plurality of enlarged passageways 222 above the plurality of conductive tubular vias 210. (Block 1009). In some embodiments, the removing of the uppermost portion of the plurality of conductive tubular vias 210 may comprise a drilling step. In drilling embodiments, this drilling step may be performed to a controlled depth.

The method illustratively includes forming a second conductive layer 223 within the plurality of enlarged passageways 222 to provide a corresponding plurality of spaced apart female contacts 207. (Block 1011). In some embodiments, the forming of the second conductive layer 223 may comprise a plating step, but may alternatively comprise a deposition step.

The female contact 207 includes a conductive cup 212 having a lower end 213 abutting and joined to a respective conductive tubular via 210 and an upper end 214 defining a recess 215 to receive a corresponding conductive pin 203 of the connector 201. The conductive cup 212 has an outer diameter OD1 greater than an outer diameter OD2 of the respective conductive tubular via 210.

Figure 6A:
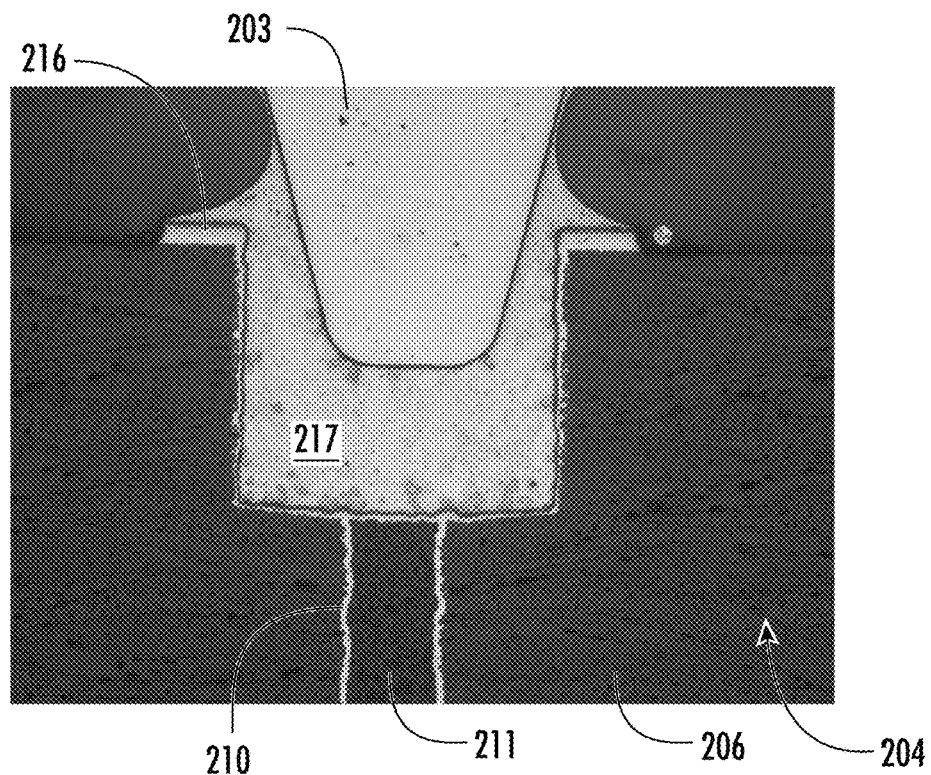
FIGS. 6A and 6B are orthogonal cross-section microscope images of the pin and female contact from an example embodiment of the electronic device.
Figure 6B:
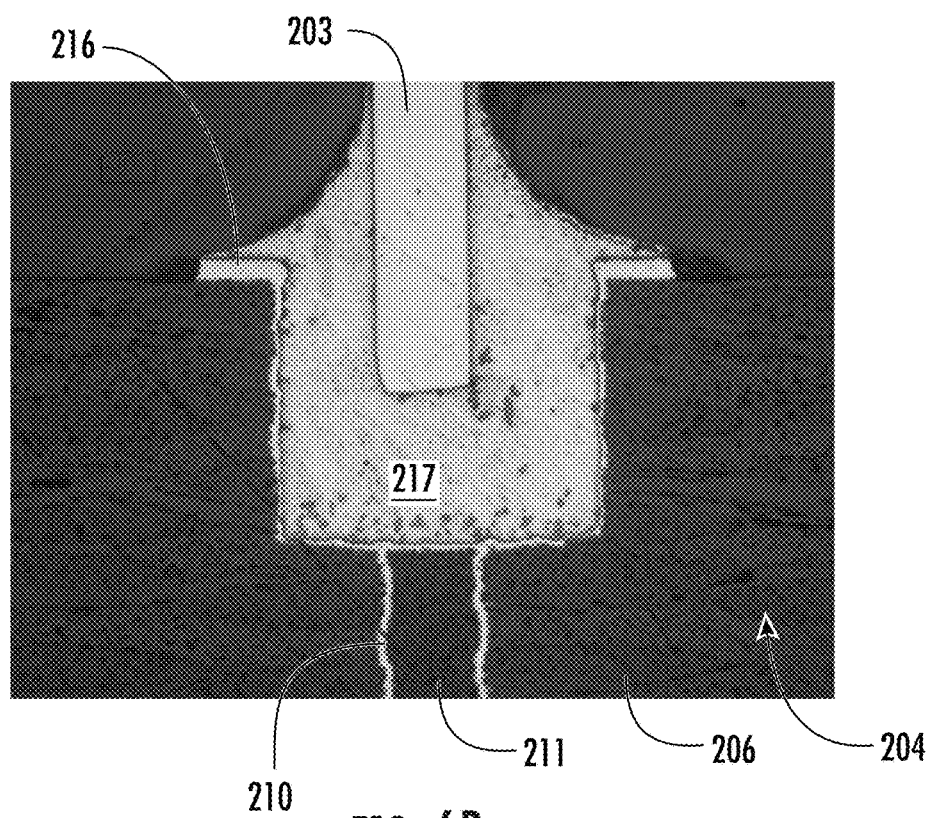

As perhaps best seen in FIGS. 6A-6B, the method comprises positioning the connector 201 and circuit board 204 so that the plurality of conductive pins 203a-203k are aligned with the plurality of spaced apart female contacts 207a-207k. The method further comprises depositing solder 217 within the recess 215 of each conductive cup 212 to surround the corresponding conductive pin 203a-203k upon assembly. (Block 1013). The method ends at Block 1015.

Figure 7:
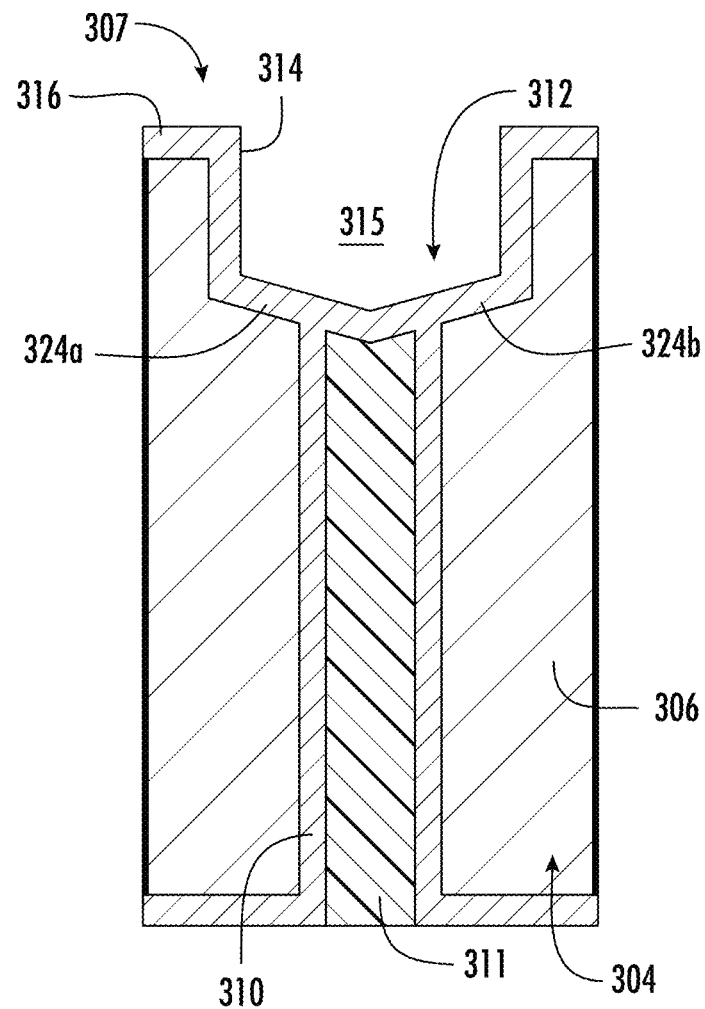
FIG. 7 is a schematic cross-section view of female contact also along line 1-1, according to a second embodiment of the present disclosure.

Referring now additionally to FIG. 7, another embodiment of the female contact 307 is now described. In this embodiment of the female contact 307, those elements already discussed above with respect to FIGS. 2-5 are incremented by 100 and most require no further discussion herein. This embodiment differs from the previous embodiment in that this female contact 307 illustratively includes a conductive cup 312 having a lower end 313 abutting and joined to the conductive tubular via 310. Here, the lower end 313 illustratively includes canted surfaces 324a-324b bending inwardly to retain a conductive pin (not shown).

Figure 8:
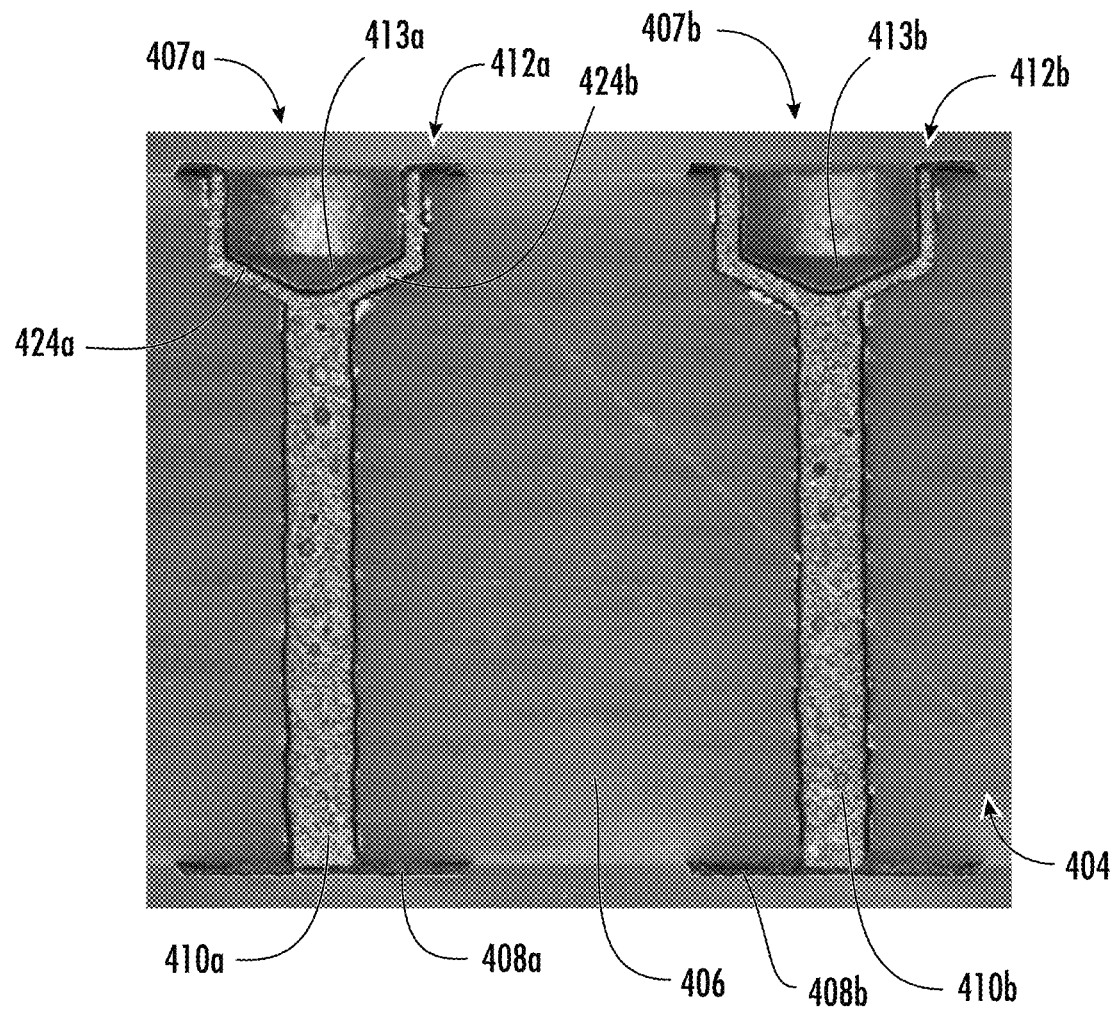
FIG. 8 is a cross-section microscope image of female contact, according to a third embodiment of the present disclosure.
Figure 9A:
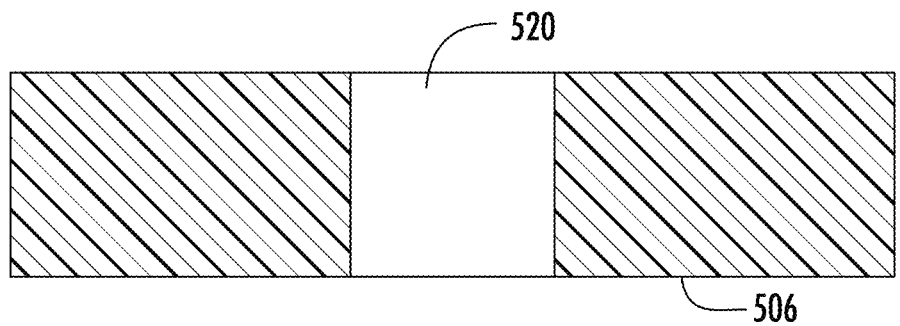
FIGS. 9A-9F are schematic cross-section views of an electric device, according to a fourth embodiment of the present disclosure, during a method for making the circuit board.
Figure 9B:
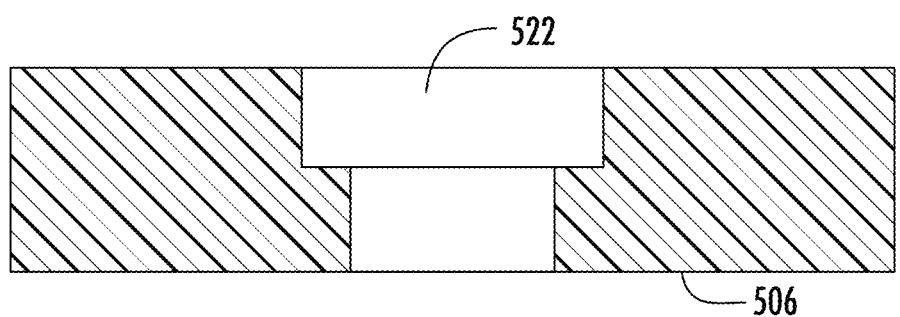
Figure 9C:
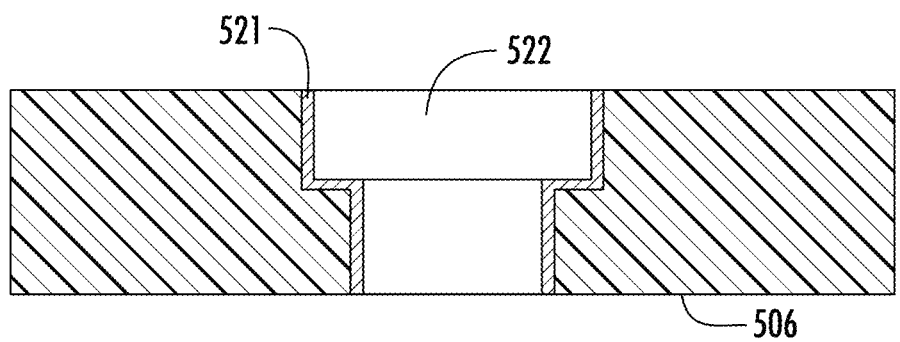
Figure 9D:
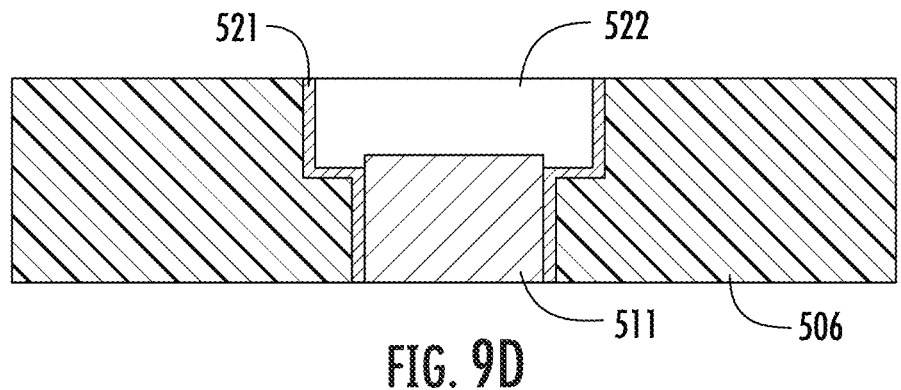
Figure 9E:
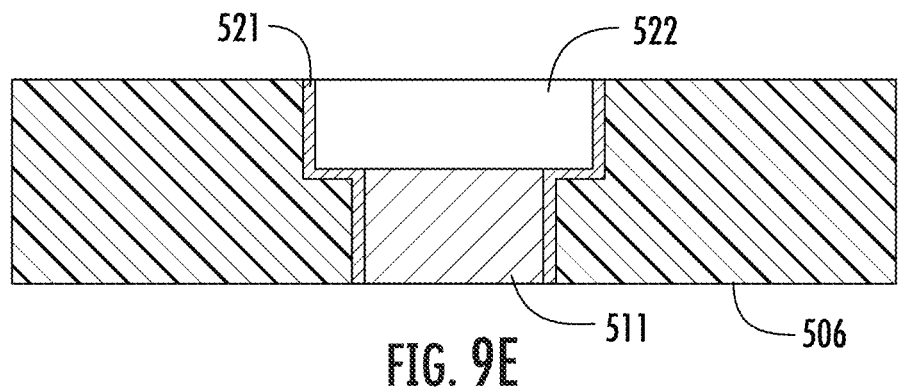
Figure 9F:
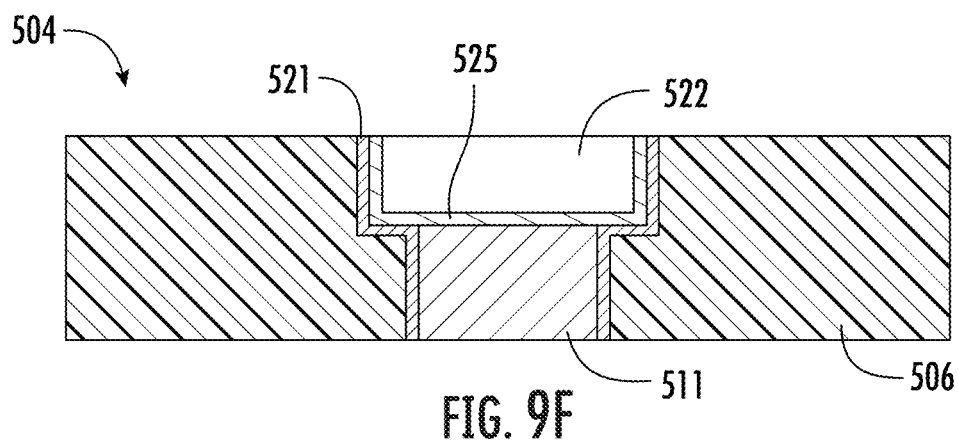

Referring now additionally to FIG. 8, another embodiment of the female contact 407a-407b is now described. In this embodiment of the female contact 407a-407b, those elements already discussed above with respect to FIGS. 2-5 are incremented by 200 and most require no further discussion herein. This embodiment differs from the previous embodiment in that this the female contact 407a-407b illustratively includes a conductive cup 412a-412b having a lower end 413a-413b abutting and joined to the conductive via 410a-41b. Here, the lower end 413a-413b illustratively includes canted surfaces 424a-424b. Also, the conductive via 410a-410b and core are integral and comprise entirely conductive material. In some embodiments, the conductive tubular via 410a-410b and the conductive cup 412a-412b are formed from a single conductive material formation step, for example, a plating, or by depositing a conductive epoxy.

In other embodiments (See FIGS. 9A-9F), the conductive tubular via 410a-410b and the conductive cup 412a-412b are formed in multiple steps. In particular, the first step may include a plating step, and the second step may comprise filling conductive epoxy within the remaining passageway after the plating. After a controlled depth drilling, a second and final plating forms the conductive cup 412a-412b.

Referring now additionally to FIGS. 9A-9F, another embodiment of the method of making a circuit board 504 is now described. In this embodiment of the method those elements already discussed above with respect to FIGS. 2-5 are incremented by 300 and most require no further discussion herein. The method comprises forming a plurality of passageways 520 in a dielectric layer 506. For illustrative clarity, only one passageway 520 is shown. The method comprises removing an uppermost portion of the plurality of passageways 520 to define a corresponding plurality of enlarged passageways 522 above the plurality of passageways. The forming of the plurality of passageways 520 and plurality of enlarged passageways 522 may comprise one or more mechanical drilling steps in some embodiments. In other embodiments, these steps may comprise an etching step or laser drilling.

The method illustratively includes forming a first conductive layer 521 within the plurality of passageways 520 and the plurality of enlarged passageways 522. In some embodiments, the forming of the first conductive layer 221 may comprise a plating step (e.g. monolithic plating), but may alternatively comprise a deposition step.

The method comprises forming a conductive core 511 within the plurality of passageways 520 to define a plurality of conductive tubular vias. The forming of the core 511 may comprise an injection of conductive fill material into the plurality of passageways 520 with the first conductive layer 521 therein. The method comprises removing of the uppermost portion of the core 511, and forming a second conductive layer 525 within the plurality of enlarged passageways 522. Helpfully, the circuit board 504 may be more mechanically resilient.

Figure 1B:
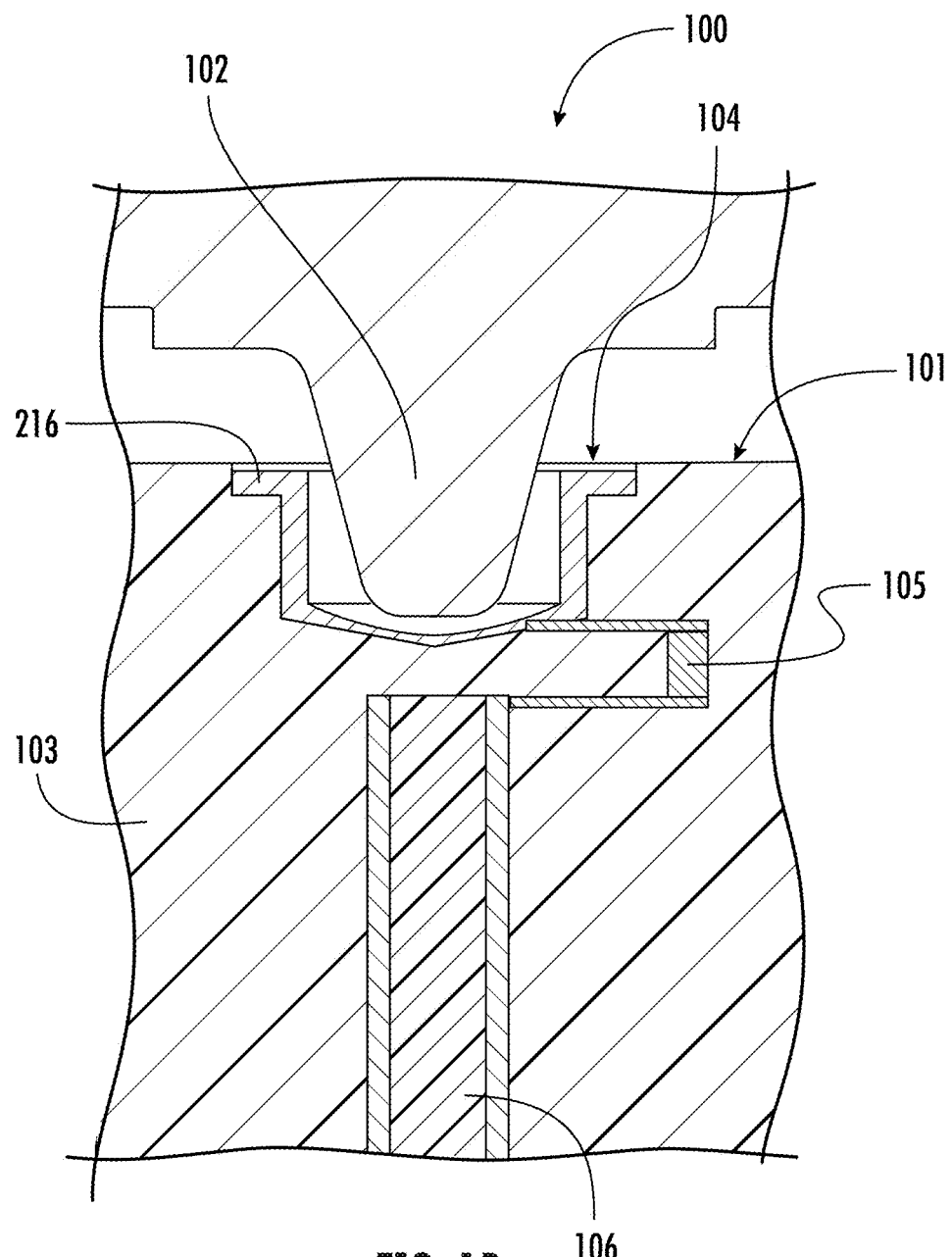
FIG. 1B is a partial schematic cross-section view of the electronic device from FIG. 1A along line 1-1.

Advantageously, the electronic device 200 provides an approach for a high speed connection with reduced cross-talk. In typical approaches with a constant diameter cup and via, the spacing of the adjacent conductive vias is greater than desired, increasing the size of the device. This may be problematic for applications with limited space, such as in aircraft. Also, the buried micro-via 105 and separate conductive cup 104, as in FIGS. 1A-1B, are expensive and complicated to manufacture. In particular, the connection 100 may require multiple lamination steps to manufacture. In some manufacturing examples, the yield for this connection 100 is as low as about 20%, thereby increasing manufacturing costs.

The electronic device 200 of the present disclosure provides an approach to the problem of the prior art. This electronic device 200 is readily manufactured at a lower cost, in some embodiments relying on simple drilling and plating steps. Moreover, the manufacturing process is less complex and offers greater yield. The electronic device 200 also maintains reduced cross-talk while providing for compact spacing between connectors.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

The invention claimed is:

1. An electronic device comprising:
   a connector comprising a connector body and a plurality of conductive pins extending outwardly from the connector body; and
   a circuit board comprising a dielectric layer having a topside and a backside opposite the topside, and a plurality of spaced apart female contacts extending therein, each female contact comprising
      a full conductive tubular via extending fully through to the backside of the dielectric layer,
      a core within the full conductive tubular via, and
      a conductive cup at the topside of the dielectric layer, the conductive cup having a continuous lower end abutting and directly joined to the full conductive tubular via and an upper end defining a recess receiving a corresponding conductive pin of the connector, the conductive cup having an outer diameter greater than an outer diameter of the full conductive tubular via.

2. The electronic device of claim 1 wherein the conductive cup comprises an uppermost flange coupled to the upper end.

3. The electronic device of claim 1 comprising solder within the recess of each conductive cup and surrounding the corresponding conductive pin.

4. The electronic device of claim 1 wherein the full conductive tubular via has a constant outer diameter.

5. The electronic device of claim 1 wherein the outer diameter of the conductive cup is within a range of 1.5 to 2.5 times the outer diameter of the full conductive tubular via.

6. The electronic device of claim 1 wherein the conductive cup has a height within a range of 0.1 to 0.5 times a height of the full conductive tubular via.

7. The electronic device of claim 1 wherein the outer diameter of the conductive cup is within a range of 500-700 microns.

8. The electronic device of claim 1 wherein the plurality of spaced apart female contacts is spaced apart a distance in a range of 1200-1500 microns.

9. The electronic device of claim 1 wherein the circuit board comprises a multilevel circuit board.

10. The electronic device of claim 1 comprising circuitry coupled to the plurality of spaced apart female contacts and operable at a frequency range less than 25 GHz.

11. The electronic device of claim 1 wherein each female contact comprises plated copper.

12. The electronic device of claim 1 wherein the core comprises a dielectric.

13. The electronic device of claim 1 wherein the core comprises a conductor.

14. The electronic device of claim 1 comprising:
   at least one additional female contact comprising a partial conductive tubular via extending partially toward the backside of the dielectric layer;
   a core within the partial conductive tubular via; and
   a conductive cup at the topside of the dielectric layer and having a continuous lower end abutting and directly joined to the partial conductive tubular via and an upper end defining a recess receiving a corresponding conductive pin of the connector, the conductive cup having an outer diameter greater than an outer diameter of the partial tubular via.

15. The electronic device of claim 14 comprising a cylindrical dielectric body aligned with the partial conductive tubular via and extending to the backside of the dielectric layer.

* * * * *